US006952437B1

(12) United States Patent
Bettiati et al.

(10) Patent No.: US 6,952,437 B1
(45) Date of Patent: Oct. 4, 2005

(54) LASER WITH WIDE OPERATING TEMPERATURE RANGE

(75) Inventors: Mauro Bettiati, Paris (FR); Gérard Gelly, Cheptainville (FR)

(73) Assignee: Avanex Corporation, Fremont, CA (US)

( * ) Notice: Subject to any disclaimer, the term of this patent is extended or adjusted under 35 U.S.C. 154(b) by 0 days.

(21) Appl. No.: 09/550,596

(22) Filed: Apr. 17, 2000

(30) Foreign Application Priority Data

Apr. 30, 1999 (FR) .................................. 99 05528

(51) Int. Cl.[7] ............................ H01S 5/00; H01S 3/08

(52) U.S. Cl. ........................... 372/92; 372/49; 372/98; 372/99; 372/102

(58) Field of Search ................................ 372/6, 98, 99, 372/108, 29.014, 96, 102, 101, 34, 29.02, 372/49, 48, 46, 50, 64, 92

(56) References Cited

U.S. PATENT DOCUMENTS 5,485,481 A * 1/1996 Ventrudo et al ............... 372/6
5,563,732 A 10/1996 Erdogan et al.
5,715,263 A 2/1998 Ventrudo et al.
5,717,711 A * 2/1998 Doussierre ett al ......... 372/102
6,233,259 B1 * 5/2001 Ventrudo et al. .............. 372/6
6,240,119 B1 * 5/2001 Ventrudo ..................... 372/96
6,343,088 B1 * 1/2002 Mugino et al. ............... 372/49

FOREIGN PATENT DOCUMENTS

EP 0 772 267 5/1997

OTHER PUBLICATIONS

Patent Abstracts of Japan, vol. 1997, No. 10, Oct. 31, 1997, JP 09-148660, Jun. 06, 1997.

* cited by examiner

*Primary Examiner*—Minsun O. Harvey
*Assistant Examiner*—Armando Rodriguez
(74) *Attorney, Agent, or Firm*—Moser, Patterson & Sheridan, LLP

(57) ABSTRACT

An optical device including a laser with a laser cavity having a gain curve with a maximum at a wavelength $\lambda_{max}$; and an optical carrier coupled to the cavity. The optical carrier includes a grating that defines a reflection peak coefficient at a wavelength $\lambda$ that is less than the wavelength $\lambda_{max}$ by at least 10 nanometers at ambient temperature.

16 Claims, 2 Drawing Sheets

LASER WITH WIDE OPERATING TEMPERATURE RANGE

TECHNICAL FIELD

This invention relates to the field of quantum well lasers comprising a reflection means external to the laser cavity.

TECHNOLOGICAL BACKGROUND

U.S. Pat. No. 5,715,263 issued to SDL describes an example of a laser shown in FIG. 2 of this patent comprising a quantum well laser 26 with an output mirror 27 outputting into an optical fiber 32. This type of laser is used in telecommunications to pump an amplifier outputting into a transmission line. According to the invention described in the SDL patent, the fiber 32 comprises a fiber Bragg grating 34 with the function of reflecting part of the light emitted by the laser 26 back to the laser 26. This patent (column 2, lines 37–45) describes how the optical spectrum of the emitting laser diode is affected if the center of the reflection band of the fiber Bragg grating is in the laser gain band. The exact effect depends on parameters such as the value of the reflection coefficient and band width of the fiber Bragg grating, the central wavelength of the grating with respect to the laser, the value of the optical distance between the laser and the grating, and the value of the current injected into the laser. In the SDL patent, the central wavelength of the Bragg grating is contained within a 10 nm band around the laser wavelength and the value of the reflection coefficient of the grating 34 is similar to the value of the output face 27 from laser 26. In the preferred embodiment, the width of the band reflected by the grating 34 and its reflection coefficient are such that the return into the laser cavity due to the output face is greater than the return due to the grating 34. Consequently, the grating 34 acts like a disturbance to the emission spectrum of laser diode 26, which has the effect of widening the emission band and thus making the diode less sensitive to disturbances caused by temperature changes or injected currents.

In order to obtain the required effect, in the preferred embodiment the grating 34 has a reflection peak that is located 1 or 2 nm from the wavelength of the diode, a reflection coefficient of 3% which, taking account of coupling between the grating and the diode, produces a return coefficient to the diode equal to 1.08%.

U.S. Pat. No. 5,563,732 issued to AT&T Corp. also describes a pumping laser 13 for an amplifier laser 12 also used to make optical transmissions. This laser 12 is stabilized to prevent fluctuations in the emitted wavelengths caused by parasite reflections from the amplifier laser 12 by means of a fiber grating 14. The inventors have found that the pumping laser 13 is stable if the reflection coefficient from the grating 14 is between 5 and 43 dB.

Experiments carried out by the applicant have shown that the use of lasers stabilized using a fiber grating can have a good influence on the operating stability of the laser and particularly on the stability of the emitted wavelength, but only within certain limits. In particular, the use of lasers stabilized as described in each of the two patents mentioned above cannot produce a laser capable of operating within a temperature range varying from −20° C. to +70° C. as currently required by most users. Therefore, there is a need for such a laser.

BRIEF DESCRIPTION OF THE INVENTION

The invention relates to a quantum well laser like the lasers described in the two documents mentioned above, which is capable of operating without any particular precautions within a temperature range between two limiting temperatures defining a range of about 100° C., and particularly within the temperature range from −20° C. to +70° C. However, it should be understood that operating between −20° C. and +70° C. is not the same thing as widening the operating band in order to give a band with an output wavelength independent of reasonable fluctuations in the operating temperature, for example within a temperature range fluctuating by 5 to 6° about a nominal operating temperature.

As in the prior art, the invention uses a quantum well laser with a laser cavity formed by a laser medium between a reflection face and an output face with a reflection coefficient,

- means of coupling the laser output to an optical fiber,
- the optical fiber with a fiber grating returning a fraction of the light received from the laser through the fiber, to the laser cavity through coupling means.

However, the invention is different from the prior art in one important respect. The inventors have observed that, at a given temperature, the gain curve for the cavity as a function of the wavelength, has a positive slope in the direction of increasing wavelengths, is maximum at a wavelength $\lambda_{max}$, and then has a negative slope. The slope coefficient of the positive slope is much smaller than the slope coefficient after the maximum. By observing the manner in which the gain curve deforms as a function of the temperature, they found that, for example for a laser operating at 980 nm at 25° C., the maximum shifted between 966 nm at −20° C. and about 995 nm at 70° C. The displacement is approximately linear with a coefficient of about 0.3 nm per degree. For the system to operate over a wide temperature range, it is necessary that the condition under which the cavity gain is equal to cavity losses is satisfied for the wavelength of the fiber Bragg grating over the entire temperature range, despite deformations to the cavity gain curve as a function of the wavelength caused by temperature variations. The inventors found that this condition can be satisfied if the value of the reflection wavelength of the fiber grating at the median temperature is at least 10 nm less than the value of the wavelength $\lambda_{max}$ for which the cavity gain is maximum. In practice, the amount to be provided should be 15 plus or minus 5 nm. The fact of using a value of the wavelength equal to about 15 nm before this maximum means that the threshold condition at which the gain is equal to losses can be satisfied over a wide temperature range, at the grating wavelength.

In summary, the invention relates to an optical device comprising:

- a quantum well laser with a laser cavity formed by a laser medium between a reflection face and an output face reflecting part of the light energy to the cavity, the curve representing the gain of the cavity as a function of the wavelength having a positive slope for increasing wavelengths, a maximum for a wavelength $\lambda_{max}$ and then a negative slope,
- means of coupling the laser output to an optical fiber, the optical fiber having a fiber grating defining a coefficient of a reflection peak for a wavelength $\lambda$ and reflecting a fraction of the light received from the laser through the fiber, to the laser cavity through coupling means, device characterized in that the value of the wavelength λ defining the reflection peak of the fiber Bragg grating is less than the value of the wavelength $\lambda_{max}$ by at least 10 nanometers.

Preferably, the energy received by the laser cavity returning from the fiber grating is greater than the energy received in return through the laser output face.

This functional characterization may be clarified by a structural characterization defining a ratio relating the coefficients of the laser output face and the grating reflection coefficient. The product of the reflection coefficient for the fiber grating and the square of the loss coefficient due to coupling between the fiber and the laser must be greater than the reflection coefficient at the cavity output face. In this way, the energy received in return from the fiber grating can no longer be considered as being a disturbance widening the output optical spectrum. The value of the wavelength reflected by the grating determines the value of the laser output wavelength. In a known manner, the value of the wavelength λ reflected by the fiber grating varies with temperature much less than the cavity. The result is that with this configuration, the optical system formed by the laser, the fiber and the coupling means is capable of operating while remaining less dependent on local temperature variations. In one embodiment of the invention, the value of the grating reflection coefficient is more than ten times greater than the reflection coefficient from the laser output face.

BRIEF DESCRIPTION OF THE DRAWINGS

An example embodiment of the invention will now be commented upon and explained using the attached drawings in which.

DESCRIPTION AND COMMENTS FOR ONE EMBODIMENT

Figure 1:
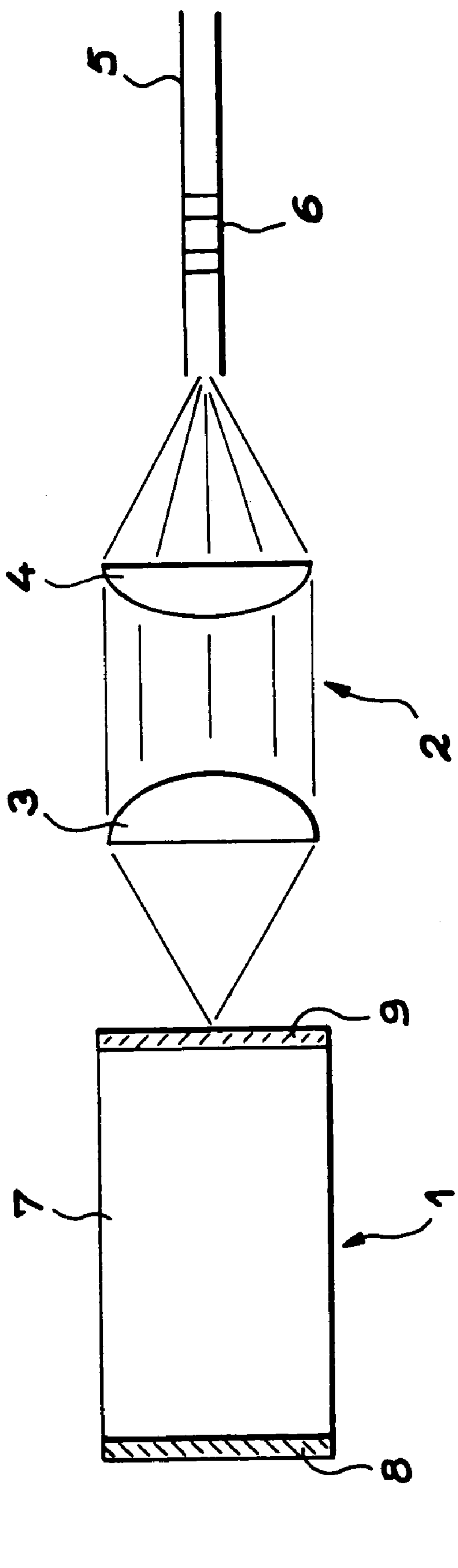
FIG. 1 is a diagram representing an embodiment of the invention.

FIG. 1 diagrammatically shows a laser cavity 1 laid out in a manner known per se such that the direction of the emitted laser beam is controlled by focusing optical means 2 into an optical fiber 5 comprising a fiber grating 6 in a known manner. The laser 1 may be composed of a laser diode comprising an epitaxied quantum well structure, in a known manner as described for example in the patent mentioned above U.S. Pat. No. 5,715,263, or an InGaAs semiconducting medium between a reflecting mirror 8 and an output face 9 with a reflection coefficient that is very low compared with the reflection coefficient of the mirror 8. The laser cavity is formed between mirrors 8 and 9.

The optical focusing means are composed of a first collimation lens 3 followed by a focusing lens 4 that focuses light towards the center of the fiber 5, in a known manner.

Figure 2:
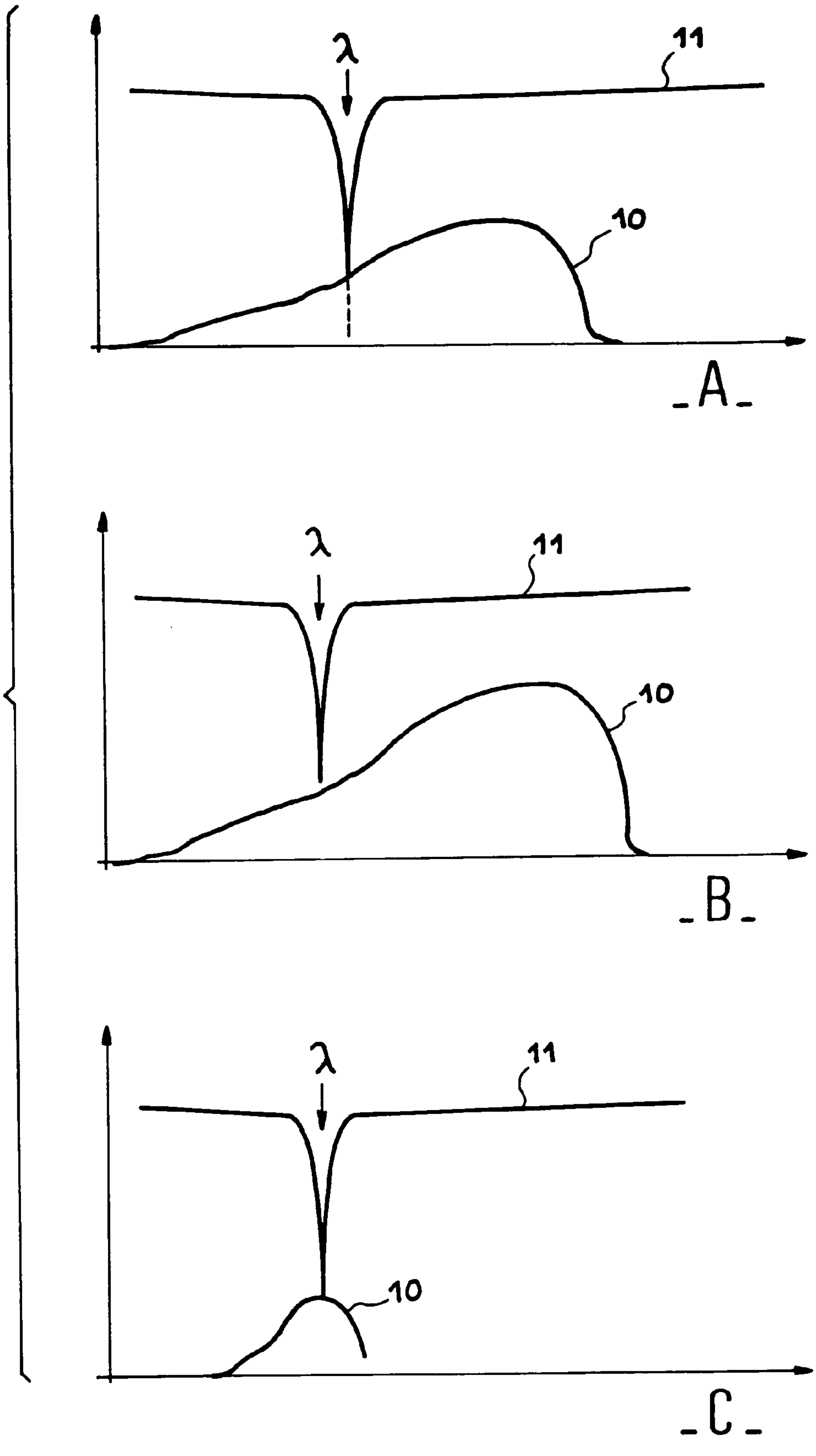
FIG. 2 is a set of three pairs of curves, each pair representing the gain and losses of the laser cavity. The pair of curves A represents the gain and losses of the laser cavity at 25° C., and the pair of curves B and C represent the gain and losses of the laser cavity at 70° C. and −25° C. respectively.

The characteristic features of the invention will now be explained and commented upon in relation to the curves in FIG. 2. Part A in the figure shows the curve 10 representing the gain of the laser cavity as a function of the wavelength, and curve 11 represents the losses of the same cavity as a function of the wavelength. The laser can only operate if losses are lower than the gain. In the case of the device shown in FIG. 1, the value of the reflection coefficients from the cavity output face 9 and the grating 6 are such that this only occurs for the wavelength λ that is the reflection wavelength of the grating 6. This is due to the fact that the quantity of light reflected by the grating is greater than the quantity of light reflected by the output face 9. In the case shown in FIG. 1, the value of the reflection coefficient of the output face 9 is typically 0.1% whereas the value of the reflection coefficient of the grating 6 is typically of the order of 1%, and in any case remains less than or equal to 5%. With this method of choosing the relative values of reflection coefficients, the emission frequency of the laser within the range authorized by the medium is determined by the reflection wavelength of the grating. As described above, the result is very good operating stability. We will consider deformations of curves 10 and 11 when the temperature varies. The curves in part A represent operation at 25° C. The same curves 10 and 11 were shown in parts B and C in FIG. 2 for temperature values equal to +70° C. and −20° C. respectively. The first noticeable fact is that there is practically no deformation in curve 11 representing losses, and all that happens is that the value of λ is slightly shifted. The gains curve 10 shows a small positive slope for small values of the wavelength, and is then equal to a maximum, and then has a steep negative slope. This is satisfied for the three temperatures shown. It can be seen that for increasing temperatures, the maximum shifts by a relatively large amount towards increasing values of the wavelength, and that the maximum increases with temperature such that the length of the line with a positive slope increases. The inventors chose a value of the reflection wavelength λ of the grating 6 at the required median operating temperature, equal to about 13 nm less than the value of the wavelength at the maximum on the gain curve 10 at the same temperature. In this case, the required operating range is −20° C. to +70° C. Therefore, the median temperature of this range is 25° C. With this choice as shown in part B, there is still a possible and stable operating point for the value of the reflection wavelength λ of the grating 6 at the maximum temperature in the range. Similarly at −20° C., the minimum temperature in the range and shown in part C in FIG. 2, there is still an operating point at the maximum on curve 10 located at a value of the wavelength close to the reflection wavelength λ of the grating 6 at this temperature. Thus the laser operates well within the required temperature range.

Obviously, the laser according to the invention may be used for the same purposes as described in prior art as mentioned above, and particularly to pump a power laser composed of a fiber doped with erbium.

What is claimed is:

1. An optical device comprising:

a laser comprising:

a reflecting mirror;

an output face comprising a reflection coefficient, the reflecting mirror and the output face forming a cavity there between; and a gain medium optically coupled between the reflecting mirror and the output face within the cavity such that the cavity has a gain with a maximum at a wavelength $\lambda_{max}$, wherein the laser is operating below a lasing threshold at $\lambda_{max}$; and an optical waveguide coupled to the cavity, the optical waveguide including an optical reflector defining a reflection peak coefficient at a wavelength λ that is less than the wavelength $\lambda_{max}$ by at least 10 nanometers at ambient temperature.

2. The optical device of claim 1, wherein the wavelength $\lambda$ is less than the wavelength $\lambda_{max}$ by 15 nm±5 nm.

3. The optical device of claim 1, wherein the wavelength $\lambda$ is less than the wavelength $\lambda_{max}$ by 13 nm when an operating temperature is equal to 25° C.

4. The optical device of claim 2, wherein the wavelength $\lambda$ is less than the wavelength $\lambda_{max}$ by 13 nm when an operating temperature is equal to 25° C.

5. The optical device of claim 1, wherein the optical reflector is a grating with a reflection coefficient that is more than 10 times greater than the reflection coefficient of the output face.

6. The optical device of claim 5, wherein the wavelength $\lambda$ is less than the wavelength $\lambda_{max}$ by 13 nm when an operating temperature is equal to 25° C.

7. The optical device of claim 1, wherein the output face has a reflection coefficient of about 0.1%.

8. The optical device of claim 7, wherein the optical reflector is a grating with a reflection coefficient of less than about 5%.

9. The optical device of claim 8, wherein the grating has a reflection coefficient of about 1%.

10. The optical device of claim 1, wherein the optical waveguide is an optical fiber.

11. The optical device of claim 1, wherein the laser is a quantum well laser.

12. The optical device of claim 1, wherein the laser is a laser diode including an epitaxied quantum well structure.

13. The optical device of claim 1, wherein the laser comprises an InGaAs semiconducting medium.

14. The optical device of claim 1, wherein the optical waveguide is optically coupled to the cavity by a first collimating lens and a focusing lens that focuses light toward the optical waveguide.

15. The optical device of claim 1, wherein the optical waveguide is an optical fiber and the optical reflector is a fiber Bragg grating.

16. The optical device of claim 15, wherein the wavelength $\lambda$ is less than the wavelength $\lambda_{max}$ by 13 nm when an operating temperature is equal to 25° C.

* * * * *